United States Patent [19]

Fujita

[11] 4,451,799
[45] May 29, 1984

[54] B-CLASS COMPLEMENTARY CIRCUIT

[75] Inventor: Osamu Fujita, Chigasaki, Japan

[73] Assignee: Matsushita Electric Industrial Co., Ltd., Kadoma, Japan

[21] Appl. No.: 286,714

[22] Filed: Jul. 24, 1981

[30] Foreign Application Priority Data

Jul. 30, 1980 [JP] Japan ................................ 55-105463

[51] Int. Cl.³ ........................... H03F 3/45; H03F 3/26
[52] U.S. Cl. .................................... 330/255; 330/257; 330/262
[58] Field of Search ................ 330/255, 257, 288, 262

[56] References Cited

U.S. PATENT DOCUMENTS 4,333,058  6/1982  Hoover ............................... 330/255
4,361,816 11/1982  Schade, Jr. ........................ 330/255

Primary Examiner—James B. Mullins
Assistant Examiner—G. Wan
Attorney, Agent, or Firm—Cushman, Darby & Cushman

[57] ABSTRACT

The present invention purports to provide a novel B-class complementary circuit of direct-coupling type having good characteristics of low dispersions of voltage gain and low temperature dependency. The apparatus of the present invention can perform the above-mentioned excellent characteristics by utilizing several current-mirror circuits in a direct coupled circuit which comprises an output stage driving circuit, a B-class complementary connected output stage, and a bias-stabilization circuit, formed as a differential amplifier working as a pre-drive stage for driving the output stage driving circuit; and by utilizing further current-mirror circuits for constant current feeding to a load circuit of the driving circuit and for the bias stabilizing circuit.

7 Claims, 7 Drawing Figures

B-CLASS COMPLEMENTARY CIRCUIT

BACKGROUND OF THE INVENTION

1. Field of the Invention

The present invention relates to an improvement in a B-class complementary circuit made in an IC providing stable performance despite temperature variation and variation of electric characteristics of various components in IC.

2. Prior Art

Hitherto a B-class complementary circuit for use, for example, as a vertical deflection circuit in a television receiver has been constituted as shown in FIG. 1. In the conventional circuit of FIG. 1, vertical oscillator 1 issues synchronizing output signals to a sawtooth-wave generator 2, which generates sawtooth-wave voltage signal synchronized by the output of the circuit 1. Numeral 3 designates a stabilized voltage source. The circuit of the transistors $Q_1$ and $Q_2$ is a bias stabilization circuit for stabilizing the operating point of output stage NPN transistors $Q_{10}$ and $Q_{11}$. Current to the bias stabilization circuit of $Q_1$, and $Q_2$ is fed through the emitter of a transistor $Q_3$ and a resistor $R_1$. The sawtooth-wave voltage input to the base (A) of the transistor $Q_1$ is amplified by the differential amplifier $Q_1$-$Q_2$ and fed to the base (C) of a driving transistor $Q_8$. A transistor $Q_7$ is a load of the driving transistor $Q_8$ which is fed of the collector current therethrough. And at the same time, the transistor $Q_7$ and transistors $Q_5$-$Q_6$ constitute a current mirror circuit. By means of this current mirror circuit, mean value of the collector current of the transistor $Q_7$ (whose collector current is controlled by the current-mirror circuits) is equivalent to that of the transistor $Q_4$, since the latter is connected by collector-to-collector in series to the transistor $Q_5$. A PNP transistor $Q_9$ and the output transistor $Q_{11}$ form a composite Darlington transistor-circuit, and diodes $D_2$ and $D_3$ compensate the base-emitter threshold voltages of transistors $Q_9$ and $Q_{10}$.

In the conventional circuit of FIG. 1, the output provided at the output terminal E is fed to a deflection coil L as a load. $C_2$ designates output coupling capacitor, $R_{10}$ designates a resistor through which a part of the sawtooth-wave voltage is taken out from a current of the deflection coil L in order to improve linearity of the sawtooth-wave voltage. The voltage taken out through the resistor $R_7$ is smoothed by a capacitor $C_3$, divided by a dividing network $R_7$, $R_8$, and then this smoothed voltage is fed back to the base (A) of the transistor $Q_1$ through $R_9$. At the point F, an output signal of a parabola-shaped wave form having a mean value of the outputs of the transistors $Q_{10}$ and $Q_{11}$ appears. The differential circuit $Q_1$-$Q_2$ compares the signal at the point A with the reference voltage at the point B, so that the voltage at the point A is controlled to become equal to the reference potential at the point B. The operation of the output sawtooth-wave of the output stage $Q_{10}$-$Q_{11}$ is stabilized by the negative feed-back through the register $R_9$, in such a manner that the mean voltage of point E is at a predetermined value.

The above-mentioned conventional circuit has the following three defects:

(1) Firstly, the output signal amplitude of the output stage $Q_{10}$-$Q_{11}$ does not respond to increases and decreases in the source voltage $V_{cc}$ of the power source. Accordingly upon increase and decrease of the source voltage $V_{cc}$, the output signal becomes saturated at its ground level side or its source voltage level side, thereby causing vertical shrinkage at the upper end parts or lower end parts of the image.

(2) Secondly, spread of the voltage gain from point A to point E due to the spread of resistances value of the circuit becomes large.

(3) Thirdly, temperature dependency of the voltage gain between the point A and point E is undesirably large.

The above-mentioned defects of the conventional apparatus of FIG. 1 are elucidated more in detail in the following With respect to the first defect, the mean value $\overline{V}_o$ at the point E of the output stage $Q_{10}$-$Q_{11}$ is given by the following equation (1).

$$\overline{V}_o \approx \frac{R_7 + R_8}{R_8} \cdot \frac{R_4}{R_3 + R_4} \cdot (V_s - V_{BE4}), \tag{1}$$

where:
  $V_s$ is stabilized output voltage of the stabilized voltage source 3,
  $V_{BE4}$ is base-emitter forward voltage of the transistor $Q_4$, and
  $R_3$, $R_4$, $R_7$ and $R_8$ are the values of resistors of the same respective designations.

In the circuit, the voltage $V_s$ is independent from changes in the power source voltage Vcc. On the other hand, output voltage of the sawtooth-wave generator 2, to be supplied at the point A (the base of the transistor $Q_1$) generally changes roughly proportional to changes in the source voltage $V_{cc}$. FIG. 2 shows relation between various voltages to the power source voltage plotted on the abscissa. In FIG. 2:
  curve a shows the source voltage $V_{cc}$,
  curve b shows the saturation level at the power source voltage side (higher side) of the output stage $Q_{10}$-$Q_{11}$,
  curve c shows the saturation level at the ground voltage side (lower side) of the output stage $Q_{10}$-$Q_{11}$,
  curve d shows the mean voltage $\overline{V}_o$ of the output signal at the point E,
  curve e shows upper end voltage of the output signal, and
  curve f shows lower end voltage of the output signal.

Now, the $V_{cc}$ is set at such an appropriate operation point $V_{cc1}$, where a voltage difference between the curve b and curve e and a voltage difference between the curve c and curve f is equal. Then the curve c and curve f cross at $V_{cc}=V_{cc3}$, and the curve b and curve e cross at $V_{cc}=V_{cc2}$ as shown in FIG. 2. This means that as the power source voltage $V_{cc}$ goes down, when $V_{cc}$ becomes lower than $V_{cc2}$ the upper end of the sawtooth-wave becomes saturated thereby forming upper-end shrinkage of reproduced images. On the other hand, as the power source voltage $V_{cc}$ goes up and when $V_{cc}$ becomes higher than $V_{cc3}$ the lower ends of the sawtooth-wave becomes saturated thereby forming lower-end shrinkage of reproduced images. Accordingly, for instance, a battery voltage drops in a battery operated television set, the lower end of the picture shrinks when the power source voltage becomes low.

The second and the third defects are elucidated below:

The voltage gain $G_v$ from the point A to point E of the circuit of FIG. 1 is represented as follows:

$$G_V \approx g_{m1}(R_2//h_{FE8} \cdot R_5) \cdot \frac{(R_{07}//h_{FEO} \cdot R_L)h_{FE8}}{(1 + h_{FE8}) \cdot R_5}, \quad (2)$$

$$\approx g_{m1} \frac{h_{FE8} \cdot R_2}{R_2 + h_{FE8} \cdot R_5} \cdot \frac{h_{FEO} \cdot R_{07} \cdot R_L}{R_{07} + h_{FEO} \cdot R_L}$$

where:
$g_{m1}$ is transfer admittance of the differential amplifier of $Q_1$ and $Q_2$.
$h_{FE8}$ is DC current amplification factor of the driving transistor $Q_8$, and it is provided that $h_{FE8} >> 1$.
$h_{FEO}$ is DC current amplification factor of the output transistors $Q_{10}+Q_{11}$,
$R_{07}$ is output impedance of the transistor $Q_7$
$R_L$ is the impedance of the load L, and
$R_2$ and $R_5$ are the resistance value of the resistors of the same designations.

(The above-mentioned equation (2) is described in detail in a book entitled "IC Kyoshitsu" (IC classroom) published by NHK shuppan (Publishing department of the Japan Broadcasting Corporation), page 180–184.)

The transfer admittance $g_{m1}$ can be represented by the following equation (3):

$$g_{m1} = A \cdot (q/4kT) \cdot I_{o1} \quad (3)$$

where:
A is a factor of the transfer admittance $g_{m1}$ for the difference of two input voltages to the two bases of the differential amplifier $Q_1$-$Q_2$,
$I_{o1}$ is the current through the current source $Q_3$-$R_1$ to the differential amplifier $Q_1$-$Q_2$,
k is the Boltzman's constant,
T is the absolute temperature, and
q is the charge of an electron.

Now, A and $I_{o1}$ are calculated below:
By selecting the collector current of the transistor $Q_7$ to be sufficiently larger than the base current of the output stage transistors $Q_{10}$ and $Q_{11}$, the mean collector current $\bar{i}_{c8}$ of the transistor $Q_8$ is made substantially equal to the collector current of the transistor $Q_7$. By selecting the current flow through resistor $R_2$ to be sufficiently larger than the base current of the driving transistor $Q_8$, the mean collector current $\bar{i}_{c2}$ necessitated for the transistor $Q_2$ is given by the following equation (4):

$$\bar{i}_{C2} \approx (1/R_2)(V_{BE8} + R_5 \cdot \bar{i}_{c7}) \quad (4),$$

where:
$V_{BE8}$ is base-emitter forward voltage of the driving transistor $Q_8$, and
$\bar{i}_{c7}$ is the mean value of the collector current of the transistor $Q_7$.

The current $\bar{i}_{c7}$ is given by the following equation (5):

$$\bar{i}_{c7} = I_{C4} = \frac{V_S - V_{BE4}}{R_3 + R_4}, \quad (5)$$

where:
$I_{C4}$ is the collector current of the transistor $Q_4$.
$R_3$ and $R_4$ are resistances of the resistors of the same respective designations.
$V_{BE4}$ is a base-emitter forward voltage of the transistor $Q_4$.

Hereinafter in the circuit of FIG. 1, collector current represented by a mark $\bar{i}_{cj}$ is the mean value of pulsating collector current of a transistor marked $Q_j$, and the collector current represented by the mark $i_{Ck}$ is the DC collector current of a transistor marked $Q_k$. And $I_{o1}$ is given by the following equation (6):

$$I_{o1} = \frac{1}{R_1} \cdot \left( V_S - V_{BE3} - V_{BE2} - \frac{R_4}{R_3 + R_4}(V_S - V_{BE4}) \right). \quad (6)$$

where:
$R_1$, $R_3$ and $R_4$ are resistances of the resistors of the same designations, and
$V_{BE2}$, $V_{BE3}$ and $V_{BE4}$ are base-emitter forward voltages of the transistors $Q_2$, $Q_3$ and $Q_4$, respectively.

Since the mean collector current $\bar{i}_{C1}$ is given by $$\bar{i}_{C1} \approx I_{o1} - \bar{i}_{C2} \quad (7),$$

the mean collector current $\bar{i}_{C2}$ is derived as follows from the equations (4) and (5):

$$\bar{i}_{C2} \approx \frac{1}{R_2} \left\{ V_{BE8} + \frac{R_5(V_S - V_{BE4})}{R_3 + R_4} \right\}, \quad (8)$$

and therefore, further from the equation (7), $$\bar{i}_{C1} \approx \frac{1}{R_1} \left( V_S - V_{BE3} - V_{BE2} - \frac{R_4}{R_3 + R_4}(V_S - V_{BE4}) \right) - \frac{1}{R_1} \left\{ V_{BE8} + \frac{R_5(V_S - V_{BE4})}{R_3 + R_4} \right\}. \quad (9)$$

As is observed from the equations (2), (3), (6), (8) and (9), the apparatus of the prior art of FIG. 1 has a large number of components which have relevancy to the voltage gain $G_v$ and therefore the spread of the electric values such as resistances, current amplification factors, etc., due to temperature change greatly influences the voltage gain $G_v$. Therefore, for example, the voltage gain decreases as a result of the spread of the constants of the components, and, further, the amplitude of the vertical deflection voltage changes considerably with temperature, thereby the height of the image shrinks. If a strong negative AC feed back is applied to the circuit by selecting the voltage gain to be very high, the height change of the image due to temperature change is small, but undesirable high frequency oscillation is likely to occur; accordingly, the voltage gain $G_v$ is necessary to have desired value in spite of the existence of spreads of values of components.

SUMMARY OF THE INVENTION

Accordingly, the present invention provides a novel B-class complementary circuit of direct-coupling type having good characteristics of narrow spread of voltage gain and low temperature dependency. The apparatus of the present invention provides the above-mentioned excellent characteristics by utilizing several current-mirror circuits in a direct coupled circuit which comprises
an output stage driving circuit,
a B-class complementary connected output stage, and
a bias-stabilization circuit, constituted as a differential amplifier working as a predrive stage for driving the output stage driving circuit; and by utilizing further current-mirror circuits for constant current feeding to a load circuit of the driving circuit and for the bias stabilizing circuit.

DESCRIPTION OF PREFERRED EMBODIMENTS

Apparatus of the B-class complementary circuit in accordance with the present invention comprises a B-class complementary circuit output stage, a driving stage for driving said output stage and having a constant-current load circuit and a predriving circuit including a differential amplifier. The present invention is characterized in that, the differential amplifier is connected to a reference voltage means by its first input terminal, to a sawtooth-wave voltage signal generator by its second input terminal and to an input end of the driving stage of current-mirror connection by its output terminal.

The differential amplifier is fed with a constant current from a first current-mirror circuit controlled by a stabilized voltage source, and the constant-current load circuit is connected, through at least one stage of other current-mirror circuits, to a second current-mirror circuit which has the same construction as the first current-mirror circuit.

Figure 3:
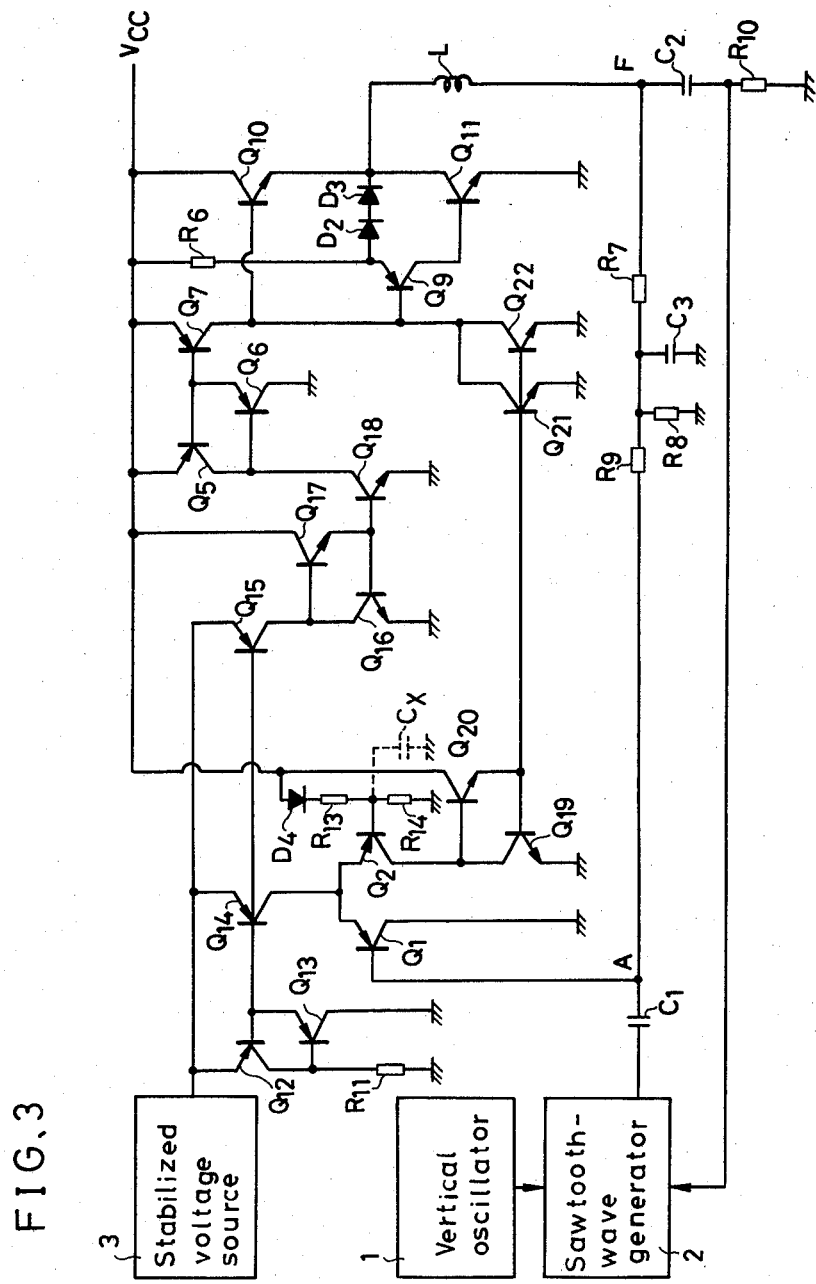
FIG. 3 is a circuit diagram of an example embodying the present invention.

FIG. 3 shows a preferred example embodying the present invention. In FIG. 3, vertical oscillator 1 oscillates a signal having the frequency of vertical scanning. A sawtooth-wave generator 2 generates sawtooth-wave voltage signals necessary for vertical scanning, based on the input signal from the vertical oscillator 1. The sawtooth-wave voltage signal is applied through a capacitor $C_1$ to the base of the transistor $Q_1$ of a differential amplifier formed by the transistor $Q_1$ and another transistor $Q_2$. The transistor $Q_2$ receives a reference voltage produced by a voltage divider formed by resistors $R_{13}$ and $R_{14}$ and a voltage-compensation diode $D_4$ at its base. An emitter-grounded primary transistor $Q_{12}$ and an emitter-grounded secondary transistor $Q_{14}$, together with an auxiliary transistor $Q_{13}$, form a first current-mirror circuit. The auxiliary transistor $Q_{13}$ is collector-grounded and is connected by its emitter commonly to the bases of the transistors $Q_{12}$ and $Q_{14}$ and by its base to the collector of the primary transistor $Q_{12}$. Accordingly, the collector currents of the primary and secondary transistors $Q_{12}$ and $Q_{14}$ are maintained equal by the mirror function and maintained constant by means of the stabilized voltage source 3. Therefore, the differential amplifier formed by the transistors $Q_1$ and $Q_2$ receives constant-controlled current through the transistor $Q_{14}$. At the same time, the transistors $Q_{12}$ and $Q_{15}$ together with $Q_{13}$ form another current-mirror circuit which maintains the collector current of the transistor $Q_{15}$ constant. The collector of the transistor $Q_{15}$ is connected to the collector of another current-mirror circuit consisting of the transistors $Q_{16}$, $Q_{18}$ and $Q_{17}$, and therefore the collector current of the transistor $Q_{18}$ is controlled constant. The collector of the transistor $Q_{18}$ is further connected to the collector of a transistor $Q_5$ of another current-mirror circuit formed by the transistors $Q_5$ and $Q_7$ together with $Q_6$. Therefore, the collector current of the transistor $Q_7$ is constant and equal to that of the transistor $Q_{12}$.

The collector of the transistor $Q_2$ is connected to the collector of the transistor $Q_{19}$, which forms a current-mirror circuit with the transistor $Q_{21}$ (and counter part transistor formed with $Q_{22}$, the same emitter-area as $Q_{21}$), together with auxiliary transistor $Q_{20}$. The transistors $Q_{21}$ and $Q_{22}$ are parallel connected and are driving stage for the complementary connected output stage transistors $Q_{10}$ and $Q_{11}$. A transistor $Q_9$ is an inverter transistor of the complementary connection $Q_{10}$-$Q_{11}$. The transistor $Q_7$ serves as a load for the driving stage transistors $Q_{21}$ and $Q_{22}$. The load L of the output stage is connected through a capacitor $C_2$ and a resistor $R_{10}$ to the ground. The voltage obtained across the resistor $R_{10}$ is fed back to the sawtooth generator 2 to improve linearity of the sawtooth output wave. The potential obtained at the junction point F between the load L and the capacitor $C_2$ is smoothed by a low-pass filter formed by a resistor $R_7$ and a capacitor $C_3$, and divided by a dividing circuit of $R_7$ and $R_8$ and through a resistor $R_9$ is given to the base A of the differential amplifier as a mean level of the sawtooth-wave input signal.

In summary, the features of the circuit of FIG. 3 is as follows:

The mean collector current of the transistor $Q_7$ and mean collector current of the transistors $Q_{21}$ and $Q_{22}$ are controlled by the collector current $I_{C12}$ of the transistor $Q_{12}$, which is fed through several current-mirror circuits, and collector current $I_{C12}$ is maintained constant by means of the stabilized voltage source 3. Therefore, both constant equilization of the mean collector currents of transistor $Q_1$ and $Q_2$, and designing the transfer conductance of the differential amplifier $Q_1$ and $Q_2$ at the optimum point become possible. In order to obtain a large transfer admittance $g_{m2}$ of the differential amplifier $Q_1$-$Q_2$ and a small change in the voltage gain $G_v$, a ratio between a first total multiplying factor of the current-mirror circuits, (which is from the second current-mirror circuit $Q_{12}+Q_{13}+Q_{15}$ to the constant current load circuit $Q_7$), and a second total multiplying factor of the other current-mirror circuits (which is from the first current-mirror circuit $Q_{12}+Q_{13}+Q_{15}$ to the driving stage $Q_{19}+Q_{20}+Q_{21}+Q_{22}$), should be preferably 1:2 or a number around it. Therefore, two parallel connected transistors $Q_{21}$ and $Q_{22}$ are used as the output stage.

Besides, by use of the current-mirror circuit for the driving stage transistors $Q_{21}$ and $Q_{22}$, the scattering and temperature dependency of the voltage gain of the circuit is minimized. Therefore, the undesirable shrinkage of the image hitherto observed due to distortion of sawtooth-wave form at source voltage changes can be eliminated.

The detailed operation is as follows:

Since, as a result of current mirror circuit chain the mean collector current $i_{c7}$ of the transistor $Q_7$ is equal to the mean collector currents $I_{C18}$, $I_{C15}$, $I_{C14}$ and $I_{C12}$ respectively of the transistors $Q_{18}$, $Q_{15}$, $Q_{14}$ and $Q_{12}$, the following equation (10) holds:

$$\bar{i}_{c7} = \bar{i}_{c8} = I_{C15} = I_{C14} = I_{C12} = \frac{V_S - V_{BE13} - V_{BE12}}{R_{11}} \quad (10)$$

where:

$V_S$ is stabilized output voltage of the stabilized voltage source 3, $V_{BE13}$ and $V_{BE12}$ are base-emitter forward voltage of the transistors $Q_{13}$ and $Q_{12}$, respectively, $R_{11}$ is resistance of the resistor $R_{11}$.

Hereinafter in the circuit of FIG. 3, collector current represented by a mark "$\bar{i}_{cj}$" is the mean value of pulsating collector current of a transistor marked "$Q_j$", and the collector current represented by the mark "$I_{ck}$" is the DC collector current of a transistor marked "$Q_k$".

On the other hand, since the collector of the transistors $Q_7$ is connected to those of the transistors $Q_{21}$ and $Q_{22}$, the following equation (11) holds:

$$\bar{i}_{C7} = \bar{i}_{C21} + \bar{i}_{C22} = 2\bar{i}_{C21} \quad (11).$$

By means of mirror circuit of the transistors $Q_{21}$ and $Q_{19}$ the following equation (12) holds:

$$\bar{i}_{C21} = \bar{i}_{C19} = \bar{i}_{C2} \quad (12),$$

and accordingly, from the equations (10), (11) and (12), $$\bar{i}_{C2} = \bar{i}_{C21} = \tfrac{1}{2} I_{C14} \quad (13),$$

where $\bar{i}_{c21}$, $\bar{i}_{c22}$, $\bar{i}_{c19}$ and $\bar{i}_{c2}$ are mean value of collector currents of the transistors $Q_{21}$, $Q_{22}$, $Q_{19}$ and $Q_2$, respectively.

The equation (13) implies that the mean collector currents $\bar{i}_{c1}$ and $\bar{i}_{c2}$ of each of the transistors $Q_1$ and $Q_2$ of the differential amplifier are half of the constant current $I_{C14}$ given by the constant current transistor $Q_{14}$, regardless of scattering of the circuit component and temperature dependency, and therefore the transfer conductance $g_{m2}$ becomes the optimum value attainable for a predetermined constant current of the constant current means $Q_{14}$.

On the other hand, the voltage gain $G_V$ and transfer conductance $g_{m2}$ of the differential amplifier is represented by the following equations: (14) and (15):

$$G_V = 2g_{m2} \cdot (R_{07}//R_{io}) = 2g_{m2} \cdot \frac{h_{FEO} \cdot R_{07} \cdot R_L}{R_{07} + h_{FEO} \cdot R_L}, \quad (14)$$

$$g_{m2} = \frac{q}{4kT} \cdot I_{O2} = \frac{q}{4kT} \cdot I_{C12} = \quad (15)$$

$$\frac{q}{4kT} \cdot \frac{V_S - V_{BE12} - V_{BE13}}{R_{11}}$$

where:

$h_{FEO}$ is DC current amplification factor of transistors of output stage $Q_{10}$, $Q_{11}$, $R_{07}$ is output impedance of transistor $Q_7$, $R_L$ is impedance of load L, $R_{io}$ is input impedance of output stage transistors $Q_{10}$ and $Q_{11}$, k is Boltzman's constant, T is absolute temperature, q is charge of electron, $I_{C12}$ is collector current of transistor $Q_{12}$, $V_S$ is output voltage of stabilized voltage source 3, $V_{BE12}$, $V_{BE13}$ are base-emitter forward voltages of transistors $Q_{12}$, $Q_{13}$, respectively.

Figure 1:
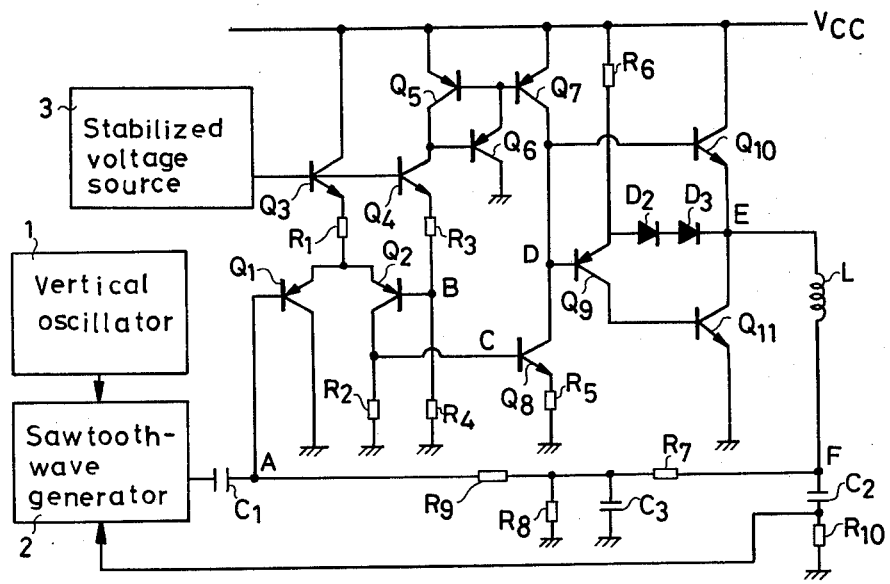
FIG. 1 is a circuit diagram of a conventional B-class complementary circuit.
Figure 2:
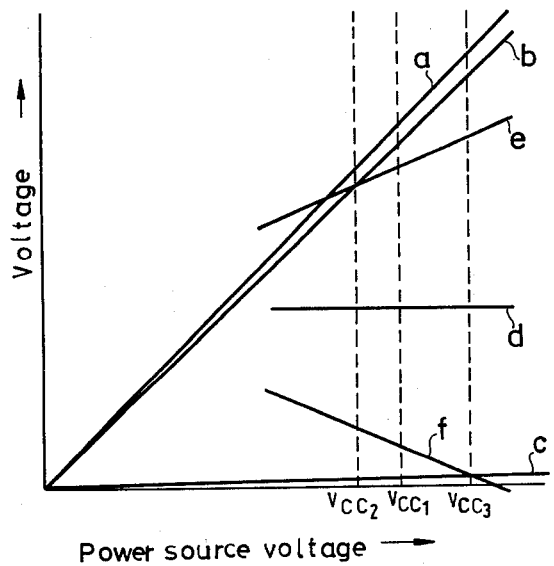
FIG. 2 is a graph showing operation of the conventional circuit of FIG. 1.

By comparing the equation (14) to the equation (2), as is elucidated in detail below, it is observed that the equation (14) for the circuit of FIG. 3 has less elements to influence the voltage gain $G_V$, than that of the equation (2) for FIG. 1 and accordingly, voltage gain deviation due to deviations of the characteristics of the components of the circuit is smaller in FIG. 3 than in FIG. 1.

Also, by comparing the equation (14) to the equation (2), as is elucidated in detail below, it is observed that the equation (14) for the circuit of FIG. 3 has less temperature dependency of the voltage gain $G_V$ than that of the equation (2) for FIG. 1.

Firstly, the degree of deviation of both equations (14) and (2) are examined. For the simplicity, we can withdraw the terms of $$\frac{h_{FEO} \cdot R_{07} \cdot R_L}{R_{07} + h_{FEO} \cdot R_L}$$

from the consideration, since these are common in both equations (14) and (2).

First, with respect to the circuit of FIG. 1, let us provide that the circuit constants are as follows:

$R_1 = 15 K\Omega$,
$R_2 = 5.6 K\Omega$,
$R_3 = 7.5 K\Omega$,
$R_4 = 1.8 k\Omega$,
$R_5 = 200 \Omega$,
$V_S = 6.2 V$,
$V_{BFn} = 0.7$ V, and that variations of absolute values of the resistances are 20%, and that variations of relative values of the resistances are 5%, and $h_{FE}$ of transistors vary within 50–200, then the variations become as follows:

$I_{01}$ varies bout $\pm 22\%$,

A varies about $\pm 15\%$, hence $g_{ml}$ varies about $\pm 37\%$, $$\frac{h_{FE8} \cdot R_2}{R_2 + h_{FE8} \cdot R_5}$$

varies about $\pm 19\%$, accordingly the total of variation excluding the effect of the term of $$\frac{h_{FEO} \cdot R_{07} \cdot R_L}{R_{07} + h_{FEO} \cdot R_L}$$

is about $\pm 56\%$.

However, in the circuit of FIG. 3, the only variation noticeable is that of $I_{02}$, which is based on the variation of the resistance of the resistor $R_{11}$, and this scattering is about $\pm 20\%$. Therefore, the spread of voltage gain $G_v$ of FIG. 3 embodying the present invention is reduced by 36% in comparison to that of the conventional circuit of FIG. 1.

Secondly, distortion of the output stage $Q_{10}$, $Q_{11}$, with respect to change of the power source voltage $V_{cc}$ is examined. In the circuit of FIG. 3 embodying the present invention, the distortion is eliminated by impressing a voltage which is substantially proportional to the power source voltage $V_{cc}$ on the base of the transistor $Q_2$. The advantage of the circuit of FIG. 3 is that, even when the base voltage of the transistor $Q_2$ varies in response to a change of the power source voltage $V_{cc}$, mean collector currents of the transistors $Q_1, Q_2, Q_{21}, Q_{22}$ and $Q_7$ do not change, and thus a stable current of the driving stage $Q_{21}, Q_{22}$ is obtainable. Even when a pulsating component is included in the power source $V_{cc}$, such pulsating component can be smoothed by connecting a capacitor $C_x$ as shown by the dotted line in FIG. 3, therefore no undesirable effects are caused by the pulsating component.

In FIG. 3, a diode $D_4$ is connected for compensation of voltage differences between the saturation voltage of the higher side (i.e. power source voltage side=higher voltage side) and the low side saturation voltage of the output stage. The high side saturation voltage is the sum of collector-emitter saturation voltage of the transistor $Q_7$ and the base-emitter forward voltage of the transistor $Q_{10}$. The lowside (i.e. ground side=lower voltage side) saturation voltage is the collector-emitter saturation voltage of the transistor $Q_{11}$. The high side saturation voltage is larger by almost one diode voltage, and hence, to compensate for this voltage difference the diode $D_4$ is inserted. If the output stage transistors $Q_{10}$ and $Q_{11}$ were of known Darlington connection, two diode in series should be inserted in place of $D_4$.

Figure 4:
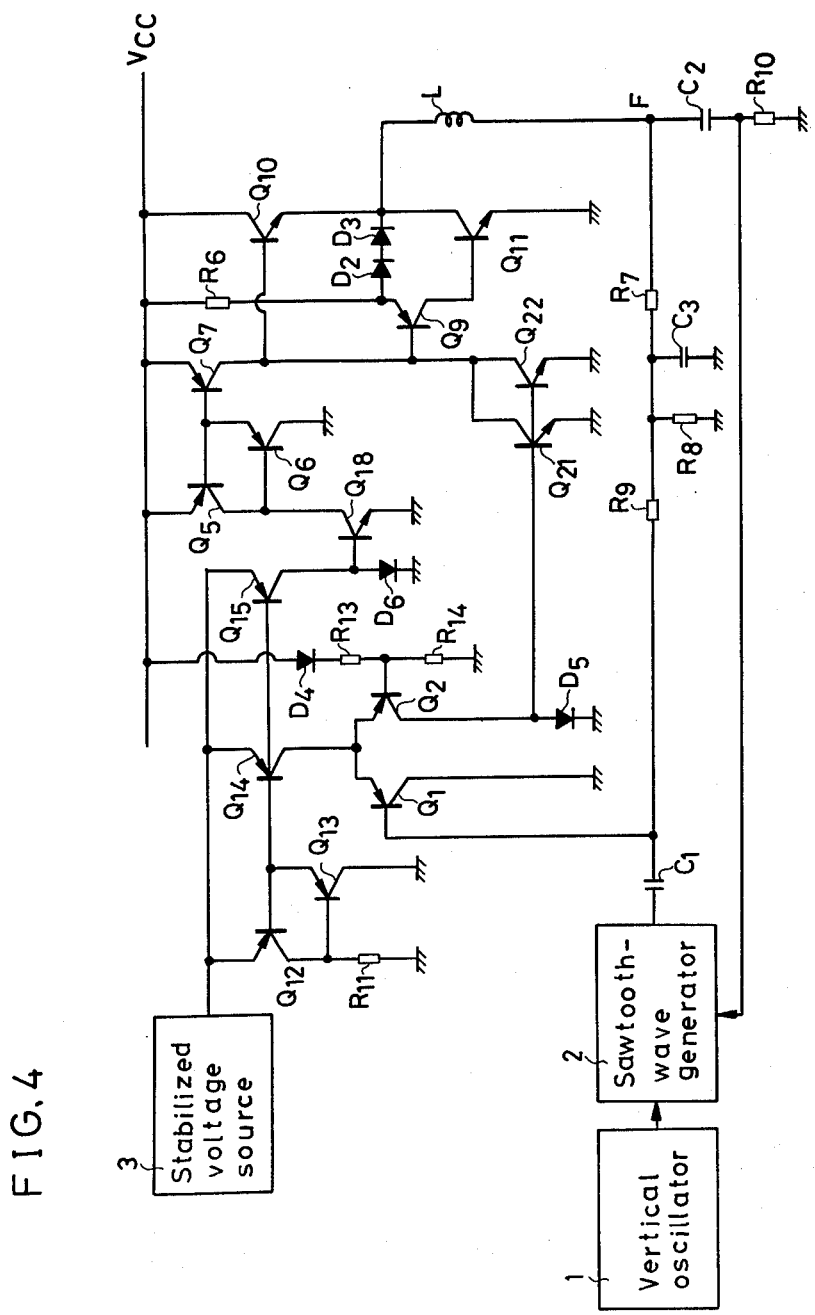
FIG. 4 is another example embodying the present invention.

Another example is shown in FIG. 4. In this example, almost parts are the same as those of FIG. 3, but in place of the transistors $Q_{16}$ and $Q_{17}$ of FIG. 3, a diode $D_6$ is used, and in place of the transistors $Q_{19}$ and $Q_{20}$ of FIG. 3 a diode $D_5$ is used, but the same current-mirror circuit functions are obtainable as is known in the art of current-mirror circuits.

Figure 5:
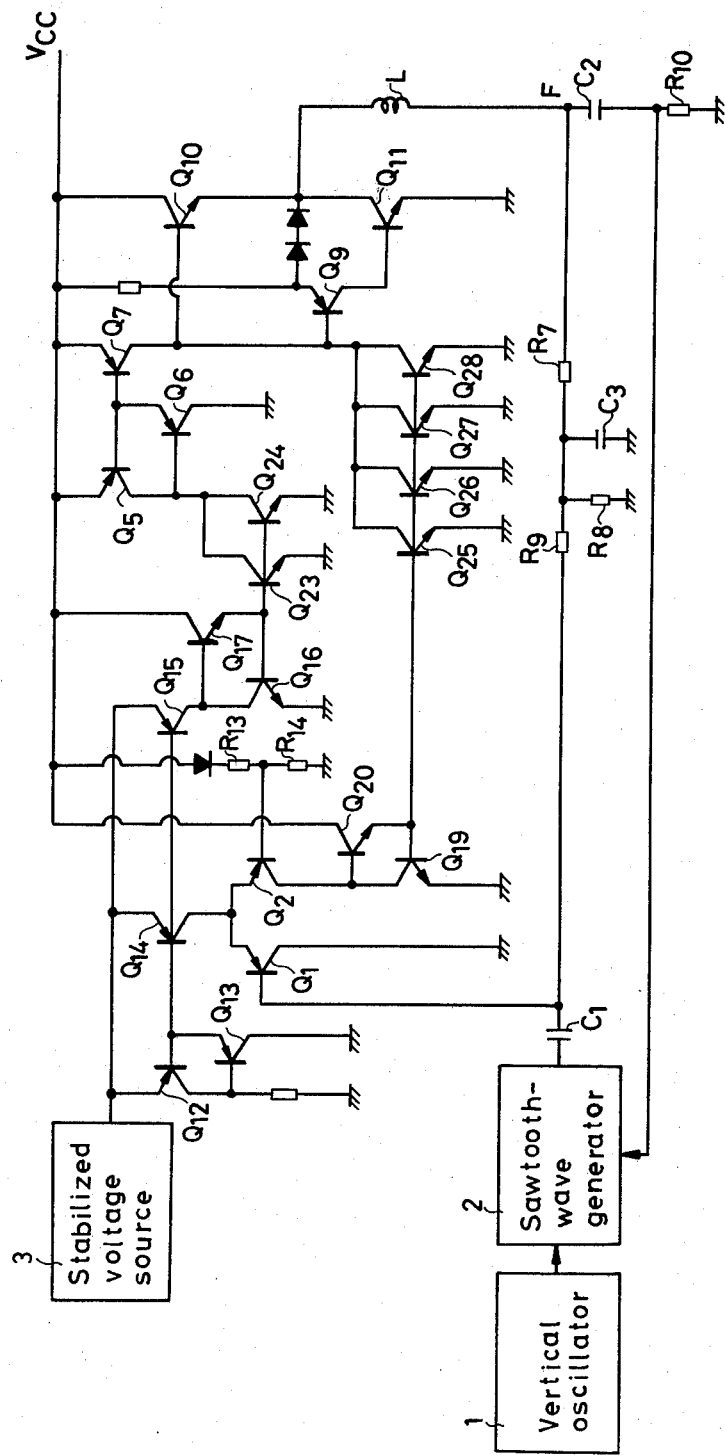
FIG. 5 is another example embodying the present invention.

Another example is shown in FIG. 5, wherein almost parts are the same as those of FIG. 3, but in place of the transistor $Q_{18}$ of FIG. 3 parallel connected pair of transistors $Q_{23}$ and $Q_{24}$ is used, thereby doubling the total multiplying factor of the current-mirror circuit of $Q_{16}$ in comparison with the circuit of FIG. 3. Furthermore, of the current-mirror circuit of the transistor $Q_{19}$ to $Q_{22}$ of FIG. 3, two transistors $Q_{21}$ and $Q_{22}$ are replaced by four transistors $Q_{25}, Q_{26}, Q_{27}$ and $Q_{28}$, thereby the total multiplying factor of the current-mirror circuit is doubled from 1:2 of FIG. 3 to 1:4 of FIG. 5. Thus, multiplying factors of the first series of current-mirror circuits from the transistor $Q_{12}$ through the transistor $Q_{15}$ to the transistor $Q_7$ and of the second series of current-mirror circuits from the transistor $Q_{12}$ through the transistor $Q_{14}$ to the transistor $Q_{28}$ are doubled. Therefore, the ratio between the total multiplying factors of the first series of the current-mirror circuit and the second series of the current-mirror circuits is still 1:2, which is the same as that of the examples of FIGS. 3 and 4.

As a result of the above-mentioned improvements the voltage gain $G_v$ is doubled in comparison with that of equation (14) as shown by the following equation (16):

$$G_v = 4g_{m2} \frac{h_{FEO} \cdot R_{07} \cdot R_L}{R_{07} + h_{FEO} \cdot R_L} . \quad (16)$$

The operation characteristics are the same as those of FIG. 3.

Figure 6:
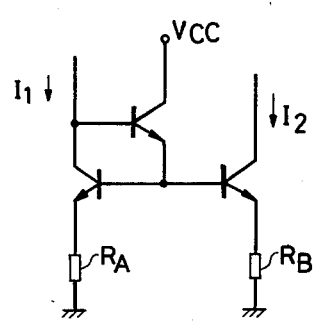
FIG. 6 is a circuit diagram of another circuit of the current-mirror circuits of FIGS. 3 to 5.
Figure 7:
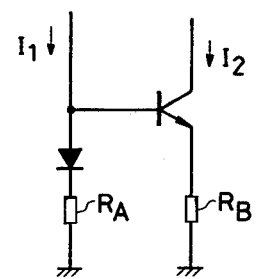
FIG. 7 is a circuit diagram of another circuit of the current-mirror circuit of FIG. 3 to 5.

In the examples of FIG. 3, FIG. 4 and FIG. 5, the amount of the output current of a particular current-mirror circuit is determined by the number of transistors and diodes, and by making the emitter junction area of the transistors or the p-n junction area of the diode equal to the input transistor. However, another method of determining the amount of the output current of the current-mirror circuit is illustrated in the circuit of FIG. 6 and/or FIG. 7, where resistors $R_A$ and $R_B$ of selected resistances are inserted in series to the emitters of the primary and secondary transistors, or input and output terminals, thereby any desired amount of output current is obtainable. The smoothing capacitance $C_3$ can be omitted when the capacitor of the output coupling capacitor $C_2$ is large (and hence pulsating voltage component appearing at the point F is small, the capacitance of the input coupling capacitor C is large and the AC output impedance of the sawtooth voltage generator is small.

What is claimed is:

1. A B-class complementary circuit comprising an output stage of B-class complementary construction, a driving stage for driving said output stage and having a constant-current load circuit, and a predriving circuit including a differential amplifier, wherein:

said differential amplifier is connected to a reference voltage means by its first input terminal, to a sawtooth-wave voltage signal generator by its second input terminal and to an input end of said driving stage by its output terminal, said differential amplifier being fed with a constant current from a first current-mirror circuit controlled by a stabilized voltage source, and said constant-current load circuit is connected to a second current-mirror circuit which has the same construction as said first current-mirror circuit through at least one stage of a third current-mirror circuit, characterized in that said first current-mirror circuit comprises an emitter-grounded primary transistor, an emitter-grounded secondary transistor, and a collector-grounded auxiliary transistor, said secondary transistor being connected to supply said constant current to said differential amplifier, and said auxiliary transistor being connected by its base to the collector of said primary transistor and by its emitter commonly to the base of said primary transistor and the base of said secondary transistor, said second current-mirror circuit comprises said primary transistor and said auxiliary transistor of said first current-mirror circuit, and a second current-mirror emitter-grounded secondary transistor, which is connected by its base to the base of said primary transistor and the emitter of said auxiliary transistor, said third current-mirror circuit stage comprises third current-mirror emitter-grounded primary transistor, which is collector-to-collector series-connected to said second current-mirror secondary transistor, a third current-mirror emitter-grounded secondary transistor and a third current-mirror collector-grounded auxiliary transistor, which is connected by its base to the collector of said third current-mirror primary transistor and by its emitter commonly to the bases of said third current-mirror primary transistor and by its emitter commonly to the bases of said third current-mirror primary transistor and said third current-mirror secondary transistor, and said driving stage comprises a driving stage emitter grounded primary transistor connected by its collector to said differential amplifier output terminal, driving stage emitter-grounded secondary transistors constituting active elements of said driving stage, and a driving stage collector-grounded auxiliary transistor, which is connected by its base to the collector of said driving stage primary transistor and by its emitter commonly to the bases of said driving stage primary transistor and said driving stage secondary transistors.

2. A B-class complementary circuit in accordance with claim 1, wherein at least one of said current-mirror circuits includes series resistors connected to input terminal and output terminal thereof, for setting a predetermined current ratio between the input current of the primary transistor and output current of the secondary transistor thereof.

3. A B-class complementary circuit in accordance with claim 1, wherein total current multiplying factor along a first path through said second current-mirror circuit to said constant current load circuit is selected to be half of total current multiplying factor along a second path through said first current-mirror circuit to said driving stage.

4. A B-class complementary circuit in accordance with claim 3, wherein at least one of said current-mirror circuits includes series resistors connected to input terminal and output terminal thereof, for setting a predetermined current ratio between the input current of the primary transistor and output current of the secondary transistor thereof.

5. A B-class complementary circuit comprising an output stage of B-class complementary construction, a driving stage for driving said output stage and having a constant-current load circuit, and a predriving circuit including a differential amplifier, wherein said differential amplifier is connected to a reference voltage means by its first input terminal, to a sawtooth-wave voltage signal generator by its second input terminal and to an input end of said driving stage of current-mirror circuit by its output terminal, said differential amplifier is fed with a constant current from a first current-mirror circuit controlled by a stabilized voltage source, and said constant-current load circuit is connected to a second current-mirror circuit which has the same construction as said first current-mirror circuit, through at least one stage of a third current-mirror circuit, characterized in that said first current-mirror circuit comprises an emitter-grounded primary transistor, an emitter-grounded secondary transistor, and a collector-grounded auxiliary transistor, said secondary transistor being connected to supply said constant current to said differential amplifier, and said auxiliary transistor being connected by its base to the collector of said primary transistor and by its emitter commonly to the base of said primary transistor and the base of said secondary transistor, said second current-mirror circuits comprises said primary transistor and said auxiliary transistor of said first current-mirror circuit, and a second current-mirror emitter-grounded secondary transistor, which is connected by its base to the base of said primary transistor and the emitter of said auxiliary transistor, said third current-mirror circuit stage comprises a first diode connected between ground and the collector of said second current-mirror secondary transistor and a third current-mirror emitter-grounded secondary transistor, which is connected by its based to the junction point between said diode and said collector, and said driving stage comprises a second diode connected between the ground and the output terminal of the differential amplifier and driving stage emitter-grounded secondary transistors, which constitute active elements of said driving stage and is connected by the bases to the junction point between said diode and said output terminal and by the collectors to said constant-current load circuit.

6. A B-class complementary circuit in accordance with claim 5, wherein total current multiplying factor along a first path through said second current-mirror circuit to said constant current load circuit is selected to be half of total current multiplying factor along a second path through said first current-mirror circuit to said driving stage.

7. A B-class complementary circuit in accordance with claim 5, wherein at least one of said current-mirror circuits includes series resistors connected to input terminal and output terminal thereof, for setting a predetermined current ratio between the input current of the primary transistor and output current of the secondary transistor thereof.

* * * * *